(12) United States Patent
Lim et al.

(10) Patent No.: US 11,183,669 B2
(45) Date of Patent: Nov. 23, 2021

(54) DISPLAY APPARATUS AND HEAD-MOUNTED DISPLAY INCLUDING THE SAME

(71) Applicant: LG Display Co., Ltd., Seoul (KR)

(72) Inventors: Hyeongjun Lim, Paju-si (KR); JiYeon Park, Paju-si (KR); Taemin Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 25 days.

(21) Appl. No.: 16/435,723

(22) Filed: Jun. 10, 2019

(65) Prior Publication Data
US 2019/0379006 A1 Dec. 12, 2019

(30) Foreign Application Priority Data
Jun. 11, 2018 (KR) .................. 10-2018-0067046

(51) Int. Cl.
*H01L 51/52* (2006.01)
*G06F 1/16* (2006.01)
*H01L 27/32* (2006.01)
*H01L 51/56* (2006.01)

(52) U.S. Cl.
CPC .......... *H01L 51/5275* (2013.01); *G06F 1/163* (2013.01); *H01L 27/322* (2013.01); *H01L 27/3246* (2013.01); *H01L 51/524* (2013.01); *H01L 51/5253* (2013.01);
(Continued)

(58) Field of Classification Search
CPC ............... H01L 51/5275; H01L 27/322; H01L 27/3246; H01L 51/524; H01L 51/5253; H01L 51/5265; H01L 51/56; H01L 27/3283; H01L 27/3244; G06F 1/163; G02B 27/0172
See application file for complete search history.

(56) References Cited

U.S. PATENT DOCUMENTS

2003/0020399 A1   1/2003   Moller et al.
2008/0253132 A1   10/2008   Urabe et al.
(Continued)

FOREIGN PATENT DOCUMENTS

CN   101042450 A   9/2007
EP   2 403 316 A1   1/2012
(Continued)

OTHER PUBLICATIONS

Machine translation of description of JPH09326297, Mar. 2021 (Year: 2021).*
(Continued)

*Primary Examiner* — Bilkis Jahan
*Assistant Examiner* — Victor V Barzykin
(74) *Attorney, Agent, or Firm* — Morgan, Lewis & Bockius LLP

(57) ABSTRACT

A display apparatus is provided. The display apparatus includes a substrate including a plurality of pixels configured to emit light, wherein the amount of emitted light is at a maximum when emitted at an angle of more than 0 degrees. The display apparatus further includes an encapsulation layer covering the plurality of pixels and including a plurality of light collecting structures each having a three-dimensional quadrangular horn shape or a three-dimensional quadrangular truncated-horn shape.

16 Claims, 17 Drawing Sheets

(52) U.S. Cl.
CPC .......... *H01L 51/5265* (2013.01); *H01L 51/56* (2013.01); *H01L 2227/323* (2013.01)

(56) References Cited

U.S. PATENT DOCUMENTS

| | | | |
|---|---|---|---|
| 2012/0043881 A1* | 2/2012 | Kuroda | G02B 5/045 |
| | | | 313/504 |
| 2012/0248970 A1 | 10/2012 | Okuyama et al. | |
| 2014/0312339 A1* | 10/2014 | Fujita | H01L 27/322 |
| | | | 257/40 |
| 2015/0008403 A1* | 1/2015 | Kudo | H01L 27/3246 |
| | | | 257/40 |
| 2018/0006264 A1* | 1/2018 | Lee | H01L 27/3246 |

FOREIGN PATENT DOCUMENTS

| | | |
|---|---|---|
| JP | H09-326297 A | 12/1997 |
| JP | 2010-225584 A | 10/2010 |
| JP | 2012-227122 A | 11/2012 |
| JP | 2014-130218 A | 7/2014 |
| JP | 2015-026418 A | 2/2015 |
| WO | 2010/113737 A1 | 10/2010 |

OTHER PUBLICATIONS

Notice of Reasons for Refusal dated Jun. 25, 2020, issued in corresponding Japanese Patent Application No. 2019-108687.
Office Action dated Jul. 1, 2021, issued in corresponding Chinese Patent Application No. 201910500653.9.

* cited by examiner

DISPLAY APPARATUS AND HEAD-MOUNTED DISPLAY INCLUDING THE SAME

The present application claims priority from and the benefit of Korean Patent Application No. 10-2018-0067046 filed on Jun. 11, 2018, which is hereby incorporated by reference in its entirety for all purposes as if fully set forth herein.

BACKGROUND

Technical Field

The present disclosure relates to a display apparatus for displaying an image and a head-mounted display (HMD).

Discussion of the Related Art

With the advancement of an information-oriented society, various requirements for display apparatuses are increasing. Therefore, various display apparatuses such as liquid crystal display (LCD) apparatuses, plasma display panels (PDPs), and organic light emitting display apparatuses are being used. Organic light emitting display apparatuses are self-emitting display apparatuses and do not need a separate backlight. Therefore, in comparison with LCD apparatuses, the organic light emitting display apparatuses may be implemented to be lightweight and thin, and have low power consumption. Also, the organic light emitting display apparatuses are driven with a direct current (DC) low voltage, have a fast response time, and have low manufacturing cost.

Recently, HMDs including an organic light emitting display apparatus have been developed. HMDs are glasses-type monitor devices for virtual reality (VR) or augmented reality (AR), which are worn in glasses or a helmet and form a focal point at a distance close to the eyes of a user. However, in HMDs having an ultra-high resolution, because an interval between pixels is very short, light emitted from each of the pixels may travel to a color filter of an adjacent pixel, causing color mixture.

SUMMARY

Accordingly, embodiments of the present disclosure are directed to a display apparatus and a head-mounted display (HMD) device that substantially obviate one or more of the problems due to limitations and disadvantages of the related art.

An aspect of the present disclosure is directed to a display apparatus and an HMD including the same, which prevent mixing of colors.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, there is provided a display apparatus, comprising: a substrate including a plurality of pixels configured to emit light, wherein the amount of emitted light is at a maximum when emitted at an angle of more than 0 degrees; and an encapsulation layer covering the plurality of pixels and including a plurality of light collecting structures each having a three-dimensional quadrangular horn shape or a three-dimensional quadrangular truncated-horn shape. In one aspect, the encapsulation layer comprises: a first inorganic layer covering the plurality of pixels; an organic layer disposed on the first inorganic layer; and a second inorganic layer covering the organic layer.

In another aspect, the organic layer comprises: a high refraction organic layer including the plurality of light collecting structures, wherein the plurality of light collecting structures collect a portion of light emitted from each of the plurality of pixels; and a low refraction organic layer on the high refraction organic layer. In another aspect, the high refraction organic layer has a first refractive index, and the low refraction organic layer has a second refractive index that is less than the first refractive index. In another aspect, the first refractive index is equal to or greater than 1.7, and the second refractive index is less than 1.7. In another aspect, each of the plurality of light collecting structures respectively correspond to each of the plurality of pixels. In another aspect, each of the plurality of light collecting structures has a height that is less than a thickness of the organic layer.

In another aspect, each of the plurality of pixels comprises: a plurality of first electrodes disposed on the substrate; a bank covering one or more edges of the plurality of first electrodes, wherein the bank includes a trench; an organic light emitting layer disposed on the plurality of first electrodes and the bank; and a second electrode disposed on the organic light emitting layer. In another aspect, an air gap is in the trench. In another aspect, the organic light emitting layer is on each of a sidewall of the trench and a floor of the trench. In another aspect, the trench passes through the bank. In another aspect, the organic light emitting layer is a white light emitting layer in each of the plurality of pixels. In another aspect, the display apparatus further comprises a color filter disposed on the encapsulation layer.

In another aspect, a head-mounted display is provided, comprising: a display panel; a lens array including a plurality of lenses configured to enlarge an image displayed by the display panel; and an accommodating case configured to accommodate the display panel and the lens array, wherein the display panel comprises: a substrate including a plurality of pixels configured to emit light, wherein the amount of emitted light is at a maximum when emitted at an angle of more than 0 degrees; and an encapsulation layer covering the plurality of pixels and including a plurality of light collecting structures each having a three-dimensional quadrangular horn shape or a three-dimensional quadrangular truncated-horn shape. In another aspect, a display panel is provided, comprising: a substrate including a plurality of pixels configured to emit light, wherein the amount of emitted light is at a maximum when emitted at an angle of more than 0 degrees; and an encapsulation layer covering the plurality of pixels and including a plurality of light collecting structures each having a three-dimensional quadrangular horn shape or a three-dimensional quadrangular truncated-horn shape.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
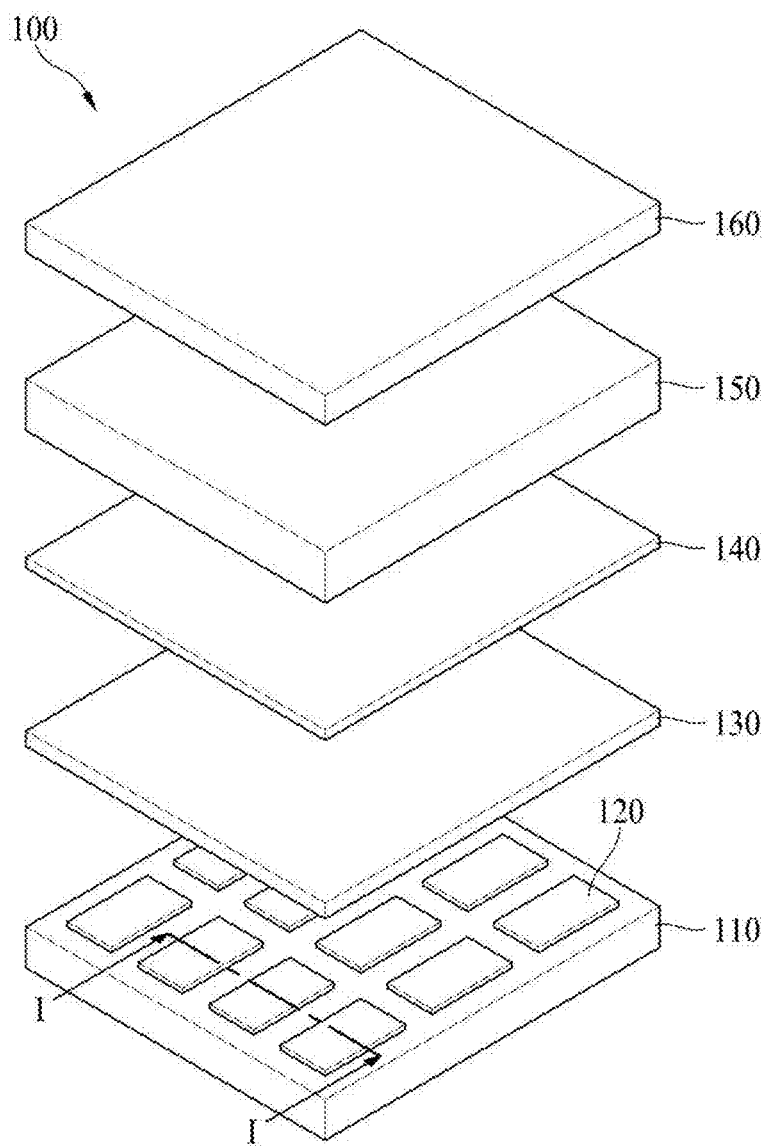
FIG. 1 illustrates a display apparatus according to an example embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure will be thorough and complete, and will fully convey the scope of the present disclosure to those skilled in the art. Further, the present disclosure is defined by the scope of the claims.

Reference will now be made in detail to embodiments of the present disclosure, examples of which may be illustrated in the accompanying drawings. In the following description, a detailed description of functions or configurations related to this document that are well-known to those skilled in the art may be omitted. The progression of processing steps and/or operations described is an example. The sequence of steps and/or operations is not limited to that set forth herein and may be changed as is known in the art or apparent to those skilled in the art, with the exception of steps and/or operations necessarily occurring in a particular order. Names of the respective elements used in the following explanations are selected only for convenience of writing the specification and may thus be different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Unless otherwise described, like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case which is not continuous may be included unless a more limiting term, such as "just," "immediate(ly)," or "direct(ly)," is used. It will be understood that, although the terms like "first," "second," etc., may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified. The term "at least one" should be understood as including any and all combinations of one or more of the associated listed items. For example, the meaning of "at least one of a first item, a second item, and a third item" encompasses the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto, unless otherwise specified. Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship. Reference will now be made in detail to example embodiments of the disclosure, which are illustrated in the accompanying drawings. Wherever possible, the same reference numbers will be used throughout the drawings to refer to the same or like parts.

Figure 2:
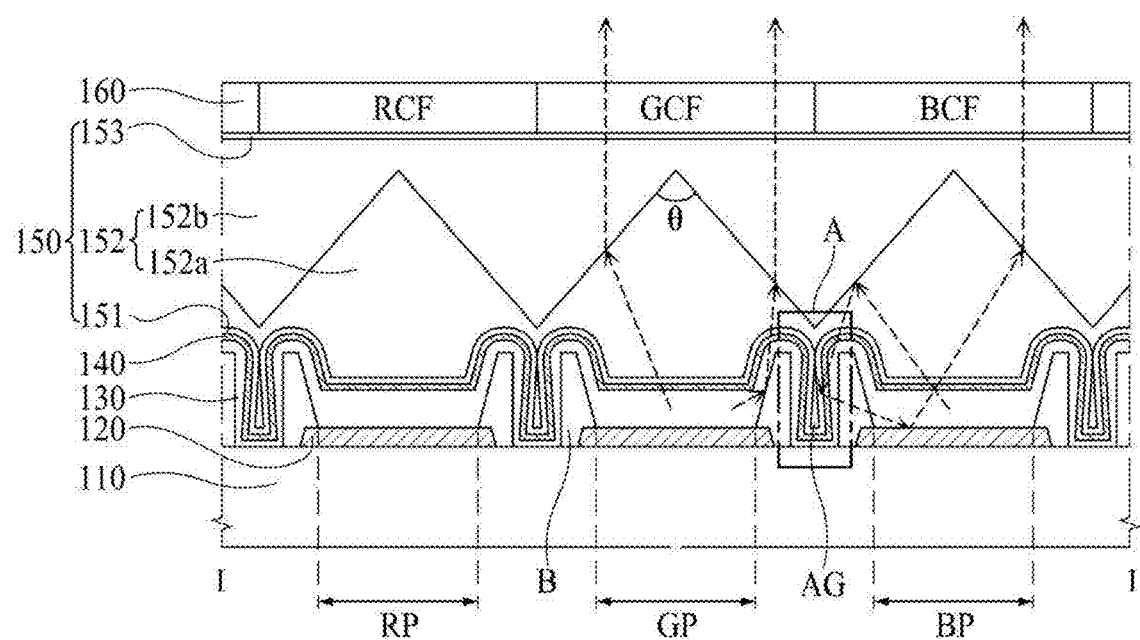
FIG. 2 is a cross-sectional view illustrating an example taken along line I-I' of FIG. 1.
Figure 3:
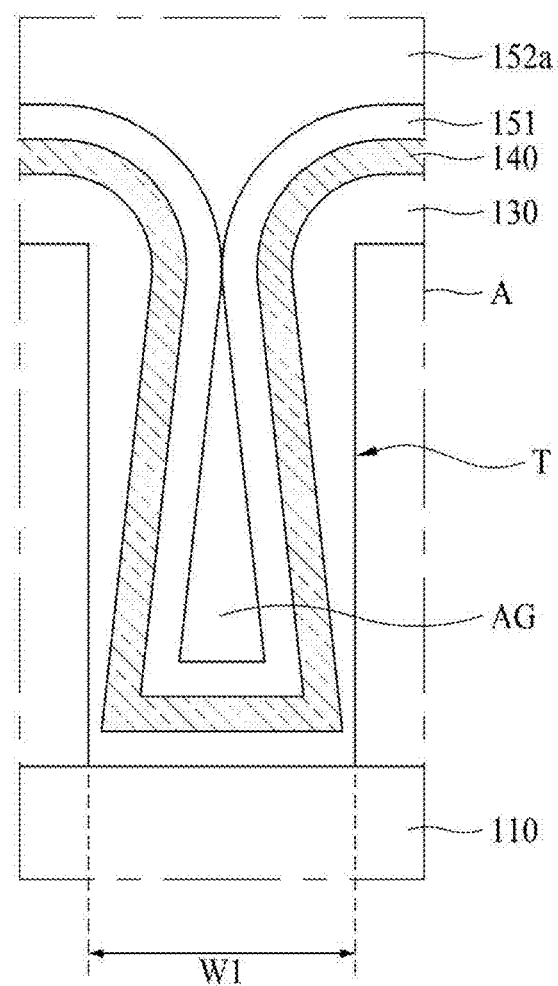
FIG. 3 is an enlarged cross-sectional view illustrating an example of region A of FIG. 2.
Figure 4:
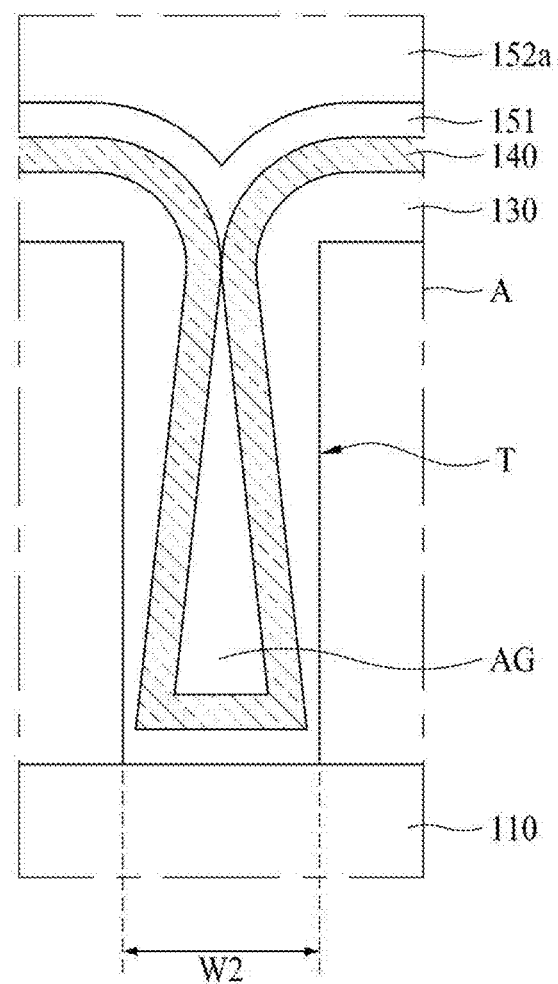
FIG. 4 is an enlarged cross-sectional view illustrating another example of region A of FIG. 2.
Figure 5:
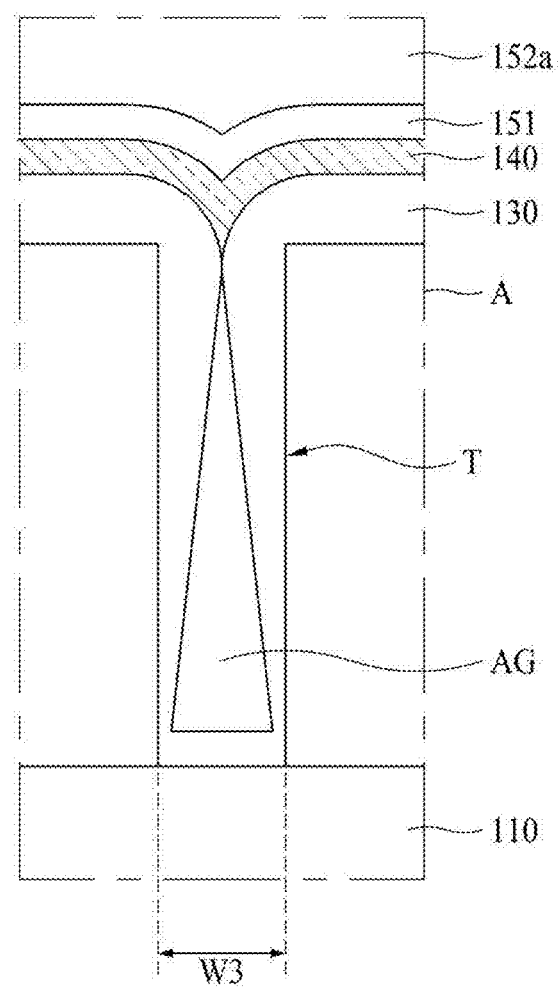
FIG. 5 is an enlarged cross-sectional view illustrating another example of region A of FIG. 2.
Figure 6:
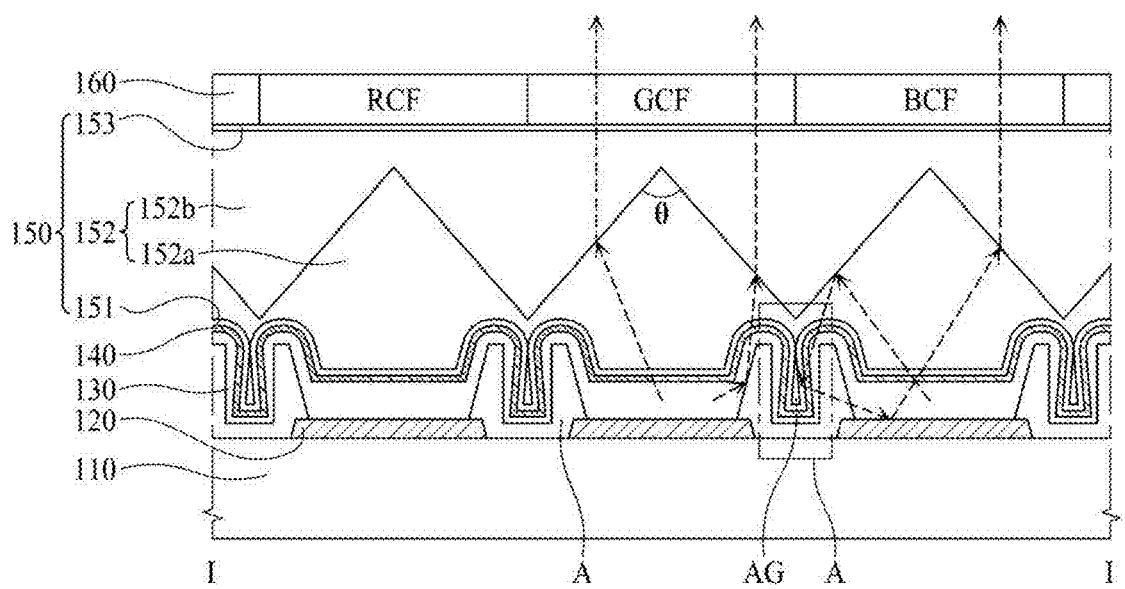
FIG. 6 is a cross-sectional view illustrating a modified example embodiment of FIG. 2.

FIG. 1 illustrates a display apparatus 100 according to an example embodiment of the present disclosure. FIG. 2 is a cross-sectional view illustrating an example taken along line I-I' of FIG. 1. FIGS. 3 to 5 are enlarged cross-sectional views illustrating various example embodiments of region A of FIG. 2. FIG. 6 is a cross-sectional view illustrating a modified example embodiment of FIG. 2.

As illustrated in FIGS. 1 and 2, the display apparatus 100 according to an example embodiment of the present disclosure may include a substrate 110, a plurality of first electrodes 120, an organic light emitting layer 130, a second electrode 140, a bank B, an encapsulation layer 150, and a color filter 160. The substrate 110 may be a plastic film, a glass substrate, or a silicon wafer substrate that may be formed through a semiconductor process. The substrate 110 may include a plurality of gate lines, a plurality of data lines, and a plurality of transistors. The gate lines and the data lines may be arranged to intersect one another. The gate lines may be connected to a gate driver and may be supplied with gate signals. The data lines may be connected to a data driver and may be supplied with data voltages.

An area where the first electrodes 120, the organic light emitting layer 130, and the second electrode 140 may be sequentially stacked may be a pixel that emits light. A pixel P may include a red pixel RP, a green pixel GP, and a blue pixel BP, and may further include a white pixel. The first electrodes 120 may be disposed apart from each other by a certain interval on the substrate 110, and thus, the pixel P may be divided by the first electrodes 120. N (where N is a positive integer) number of transistors may be in the pixel P. When a gate signal is input through a gate line, the N transistors may provide a certain voltage to the first electrodes 120 based on a data voltage of a data line.

The first electrodes 120 may be on the substrate 110. For example, each of the first electrodes 120 may include a metal material, which may be high in reflectance, such as a stacked structure (Ti/Al/Ti) of aluminum (Al) and titanium (Ti), a stacked structure (ITO/Al/ITO) of Al and indium tin oxide (ITO), an APC alloy, and/or a stacked structure (ITO/APC/ITO) of an APC alloy and ITO. The APC alloy may be an alloy of silver (Ag), palladium (Pd), and/or copper (Cu). Each of the first electrodes 120 may be an anode.

The bank B may cover an edge of the first electrode 120 on the substrate 110, and may divide a plurality of pixels P. The bank B may have a refractive index (for example, a refractive index of less than 1.7) that may be less than that of the organic light emitting layer 130. A portion of light emitted from the organic light emitting layer 130 may be incident on the bank B. Because a refractive index of the bank B may be less than that of the organic light emitting layer 130, the light incident on the bank B may be totally reflected and may travel to the encapsulation layer 150.

A trench T may be in the bank B, and may include an air gap AG. The trench T may be formed in a direction from an upper surface of the bank B to the first electrode 120 in the organic light emitting layer 130. The trench T may be formed in a slit shape, or may be formed in another shape, such as a cylindrical shape. A plurality of trenches T may be disposed apart from one another in the bank B. The organic light emitting layer 130, the second electrode 140, and a first inorganic layer 151 configuring the encapsulation layer 150 may be sequentially stacked on the bank B, and as illustrated in FIG. 2, the air gap AG may be in the trench T.

In FIG. 2, the trench T is illustrated as passing through the bank B. In another example embodiment, as illustrated in FIG. 6, the trench T may be provided so that a portion of the bank B may be recessed. The bank B may be formed of an organic layer such as acryl resin, epoxy resin, phenolic resin, polyamide resin, and/or polyimide resin.

The organic light emitting layer 130 may be on the first electrode 120 and the bank B. The organic light emitting layer 130 may include a hole transporting layer, a light emitting layer, and an electron transporting layer. If a voltage is applied to the first electrode 120 and the second electrode 140, a hole and an electron may move to the light emitting layer through the hole transporting layer and the electron transporting layer, and may be combined in the light emitting layer to emit light. The organic light emitting layer 130 may be a white light emitting layer. The organic light emitting layer 130 may be provided in each of the pixels P. If the organic light emitting layer 130 is a white light emitting layer, the organic light emitting layer 130 may be in a tandem structure of two or more stacks. Each of the stacks may include a hole transporting layer, at least one light emitting layer, and an electron transporting layer.

Moreover, a charge generating layer may be between adjacent stacks. The charge generating layer may include an n-type charge generating layer, disposed adjacent to a lower stack, and a p-type charge generating layer that may be on the n-type charge generating layer, and may be adjacent to an upper stack. The n-type charge generating layer may inject an electron into the lower stack, and the p-type charge generating layer may inject a hole into the upper stack. The n-type charge generating layer may be formed of an organic layer doped with alkali metal such as lithium (Li), sodium (Na), potassium (K), and/or cesium (Cs). Alternatively, the organic layer may be doped with alkali earth metal such as magnesium (Mg), strontium (Sr), barium (Ba), and/or radium (Ra). The p-type charge generating layer may be formed by doping a dopant on an organic material having an ability to transport holes.

The organic light emitting layer 130 may also be on the trench T provided in the bank B. The organic light emitting layer 130 may be formed through a deposition process or a solution process. If the organic light emitting layer 130 is formed through the deposition process, the organic light emitting layer 130 may be formed through an evaporation process. A layer formed through the evaporation process may not have a good step coverage characteristic. Thus, the organic light emitting layer 130 may not have a constant thickness in a region where a step height occurs due to the trench T provided in the bank B.

The organic light emitting layer 130 may be formed thickly in a portion that is bent from an upper surface of the bank B to a side surface of the trench T. A thickness of the organic light emitting layer 130 in a boundary portion between the upper surface of the bank B and a first side surface of the trench T may be thicker than that of the organic light emitting layer 130 in the first side surface or a floor of the trench T. Also, a thickness of the organic light emitting layer 130 in a boundary portion between the upper surface of the bank B and a second side surface of the trench T may be thicker than that of the organic light emitting layer 130 in the second side surface or the floor of the trench T. The first side surface and the second side surface of the trench T may face each other. As a result, an inner portion of the trench T may be narrowed in a direction from a lower portion to an upper portion thereof. The second electrode 140 and the encapsulation layer 150 may be on the organic light emitting layer 130, thereby providing the air gap AG.

A thickness of the organic light emitting layer 130 in a sidewall of the trench T provided in the bank B may be thinner than that of the organic light emitting layer 130 in the floor of the trench T. Because the trench T passes through the bank B or is recessed, a length of a current leakage path passing through the organic light emitting layer 130 between adjacent pixels P may be longer than if there is no trench T. Also, because a thickness of the organic light emitting layer 130 in a sidewall of the trench T provided in the bank B may be thinner than that of the organic light emitting layer 130 in the floor of the trench T, a resistance of the organic light emitting layer 130 may increase. Thus, an influence of leakage of a current through the organic light emitting layer 130 may be minimized on an adjacent pixel.

The second electrode 140 may be on the organic light emitting layer 130. The second electrode 140 may be provided in each of the pixels P. The second electrode 140 may be formed of a transparent conductive material (or TCO), such as indium tin oxide (ITO) or indium zinc oxide (IZO), or a semi-transmissive conductive material such as magnesium (Mg), silver (Ag), and/or an alloy of Mg and/or Ag.

The second electrode 140 may be on the trench T provided in the bank B. The second electrode 140 may be formed through a physics vapor deposition (PVD) process such as a sputtering process. A layer formed through the PVD process such as the sputtering process may have a good step coverage characteristic. Therefore, despite a step height being caused by the trench T provided in the bank B, the second electrode 140 may be on the sidewall and the floor of the trench T, and may have a uniform thickness compared to the organic light emitting layer 130.

In FIGS. 2 and 3, the second electrode 140 is illustrated on the sidewall and the floor of the second electrode 140. In another example embodiment, as illustrated in FIG. 5, the second electrode 140 may be in only the air gap AG. The organic light emitting layer 130 may be first formed on the trench T. Because the organic light emitting layer 130 may not have a good step coverage characteristic, the organic light emitting layer 130 may be formed not to have a constant thickness. Particularly, the organic light emitting layer 130 may be formed thickly in a boundary portion between the upper surface of the bank B and the side surface of the trench T. The air gap AG may be formed in the trench T so as to be narrowed in a direction from a lower portion to an upper portion thereof due to the organic light emitting layer 130. Therefore, the second electrode 140 on the organic light emitting layer 130 may not be on the sidewall and the floor of the trench T, and may be in only the air gap AG.

The encapsulation layer 150 may cover the second electrode 140. The encapsulation layer 150 may prevent oxygen or water from penetrating into the organic light emitting layer 130 and the second electrode 140. To this end, the encapsulation layer 150 may include at least one inorganic layer and at least one organic layer. The encapsulation layer 150 may include the first inorganic layer 151 and an organic layer 152. The encapsulation layer 150 may further include a second inorganic layer 153.

The first inorganic layer 151 may cover the second electrode 140. The organic layer 152 may be on the first inorganic layer 151, and particles may have a length that may be sufficient for preventing particles from penetrating the organic light emitting layer 130 and the second electrode 140 via the first inorganic layer 151. The second inorganic layer 153 may cover the organic layer 152.

Each of the first and second inorganic layers 151 and 153 may be formed of silicon nitride, aluminum nitride, zirconium nitride, titanium nitride, hafnium nitride, tantalum nitride, silicon oxide, aluminum oxide, and/or titanium oxide. Each of the first and second inorganic layers 151 and 153 may be deposited through a chemical vapor deposition (CVD) process or an atomic layer deposition (ALD) process. The first inorganic layer 151 may be on the sidewall and the floor of the trench T provided in the bank B. The first inorganic layer 151 may be on the sidewall and the floor of the trench T, and thus, the air gap AG may be in the trench T.

In FIGS. 2 and 3, the first inorganic layer 151 is illustrated on the sidewall and the floor of the trench T. If the first inorganic layer 151 is formed through the CVD process, the first inorganic layer 151 may not have a constant thickness in the trench T. Particularly, the first inorganic layer 151 may be deposited thinly in the boundary portion between the sidewall and the floor of the trench T, and thus, seam may occur. The seam occurring in the first inorganic layer 151 may provide a path through which water penetrates into the second electrode 140 and the organic light emitting layer 130.

As illustrated in FIGS. 4 and 5, the first inorganic layer 151 may be in only the air gap AG. The organic light emitting layer 130 may be first on the trench T. Because the organic light emitting layer 130 may not have a good step coverage characteristic, the organic light emitting layer 130 may not have a constant thickness, and particularly, the organic light emitting layer 130 may be formed thickly in the boundary portion between the upper surface of the bank B and the side surface of the trench T.

As illustrated in FIG. 5, the air gap AG may be formed in the trench T so as to be narrowed in a direction from a lower portion to an upper portion thereof due to the organic light emitting layer 130. Alternatively, as illustrated in FIG. 4, the air gap AG may be in the trench T so as to be narrowed in a direction from a lower portion to an upper portion thereof due to the organic light emitting layer 130 and the second electrode 140. Therefore, the first inorganic layer 151 on the organic light emitting layer 130 may not be deposited on the sidewall and the floor of the trench T and may be deposited in only the air gap AG. The first inorganic layer 151 formed in this manner may not be deposited in the trench T and may be deposited in only the air gap AG, thereby preventing the occurrence of seam.

The encapsulation layer 150 may collect light emitted from each pixel P, and may transfer the collected light to the color filter 160. To this end, the organic layer 152 configuring the encapsulation layer 150 may include a high refraction organic layer 152a and a low refraction organic layer 152b. The high refraction organic layer 152a may be on the first inorganic layer 151 to prevent particles from penetrating the organic light emitting layer 130 and the second electrode 140 via the first inorganic layer 151 and to collect light emitted from the organic light emitting layer 130.

The high refraction organic layer 152a may include a plurality of light collecting structures for collecting light incident from the organic light emitting layer 130. The plurality of light collecting structures may correspond to the plurality of pixels P and may collect light incident from each pixel P. The light collecting structures may have a three-dimensional quadrangular horn shape or a three-dimensional quadrangular truncated-horn shape. The high refraction organic layer 152a including the light collecting structures may be formed of an organic material having a refractive index (for example, a refractive index of 1.7 or more), which may be greater than that of the low refraction organic layer 152b.

Because the high refraction organic layer 152a has a refractive index that may be greater than that of the low refraction organic layer 152b, a portion of light incident from the organic light emitting layer 130 may be refracted and may be transferred to the color filter 160. The light emitted from the organic light emitting layer 130 may be incident on an interface between the high refraction organic layer 152a and the low refraction organic layer 152b. The light incident on the interface between the high refraction organic layer 152a and the low refraction organic layer 152b may be refracted if an incident angle thereof is equal to or greater than a certain angle. Refracted light may pass through the color filter 160 and may be discharged to the outside. For example, the light emitted from the organic light emitting layer 130 may be collected by the organic layer 152 including the light collecting structure.

Because the high refraction organic layer 152a has a refractive index that may be greater than that of the low refraction organic layer 152b, a portion of the light incident from the organic light emitting layer 130 may be reflected. The light emitted from the organic light emitting layer 130 may be incident on the interface between the high refraction organic layer 152a and the low refraction organic layer 152b.

The light incident on the interface between the high refraction organic layer 152a and the low refraction organic layer 152b may be reflected if the incident angle thereof is less than the certain angle. Light reflected from the interface between the high refraction organic layer 152a and the low refraction organic layer 152b may be incident on the air gap AG, as illustrated in FIG. 2. Light incident on the air gap AG may be reflected and may be incident on the first electrode 120 again. The light incident on the first electrode 120 may be reflected and may be incident on the interface between the high refraction organic layer 152a and the low refraction organic layer 152b again. The incident light may be refracted and may be transferred to the color filter 160.

The low refraction organic layer 152b may be on the high refraction organic layer 152a. The low refraction organic layer 152b may cover the high refraction organic layer 152a. The low refraction organic layer 152b may be formed of an organic material having a refractive index (for example, a refractive index of less than 1.7), which may be less than that of the high refraction organic layer 152a. For example, the low refraction organic layer 152b may be formed of a monomer.

The color filter 160 may be on the encapsulation layer 150. The color filter 160 may correspond to each of the pixels P. For example, a red color filter RCF may correspond to a red pixel RP, a green color filter GCF may correspond to a green pixel GP, and a blue color filter BCF may be disposed to correspond to a blue pixel BP. The display apparatus 100 according to an example embodiment of the present disclosure may include the high refraction organic layer 152a including the plurality of light collecting structures and the low refraction organic layer 152b disposed on the high refraction organic layer 152a. Therefore, the display apparatus 100 according to an example embodiment of the present disclosure may limit a light output angle of light emitted from the organic light emitting layer 130.

The light emitted from the organic light emitting layer 130 may be refracted or reflected by the interface between the high refraction organic layer 152a and the low refraction organic layer 152b. Light incident on the interface between the high refraction organic layer 152a and the low refraction organic layer 152b may be reflected if an incident angle thereof is less than a certain angle, and thus, may not be output to the color filter 160.

The light incident on the interface between the high refraction organic layer 152a and the low refraction organic layer 152b may be refracted and transferred to the color filter 160, if the incident angle thereof is equal to or greater than the certain angle. For example, a portion of the light emitted from the organic light emitting layer 130 may be collected, may pass through the color filter 160, and may be discharged to the outside. As a result, the display apparatus 100 according to an example embodiment of the present disclosure may include a narrow light distribution, and thus, even if an interval between the pixels P may be reduced, mixing of colors may be prevented.

Moreover, in the display apparatus 100 according to an example embodiment of the present disclosure, the trench T may be in the bank B, and the air gap AG may be in the trench T. In the display apparatus 100 according to an example embodiment of the present disclosure, light that is reflected from the interface between the high refraction organic layer 152a and the low refraction organic layer 152b through the air gap AG provided in the trench T may again travel to the high refraction organic layer 152a. The display apparatus 100 according to an example embodiment of the present disclosure may minimize the loss of the light emitted from the organic light emitting layer 130, thereby enhancing light efficiency. Moreover, in the display apparatus 100 according to an example embodiment of the present disclosure, the light collecting structure may be in the organic layer 152 configuring the encapsulation layer 150. Thus, light may be collected without an increase in thickness of the display apparatus 100.

Figure 7A:
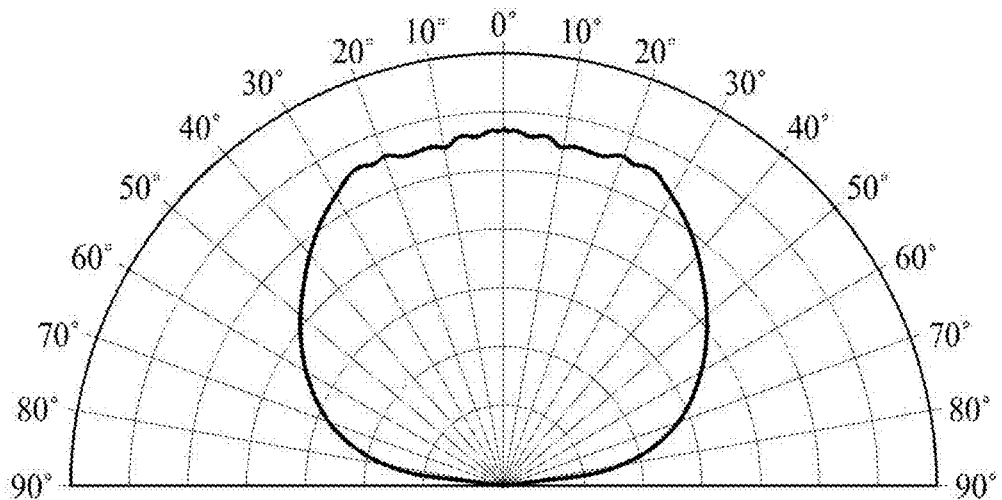
FIG. 7A illustrates a light distribution of a light source to which a micro-cavity structure is not applied.
Figure 7B:
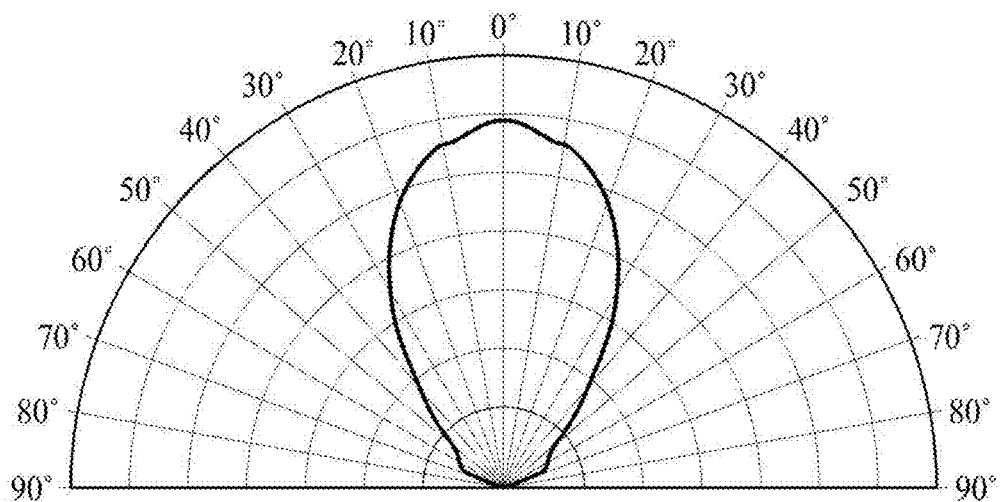
FIG. 7B illustrates a light distribution of a light source to which a micro-cavity structure is applied.
Figure 7C:
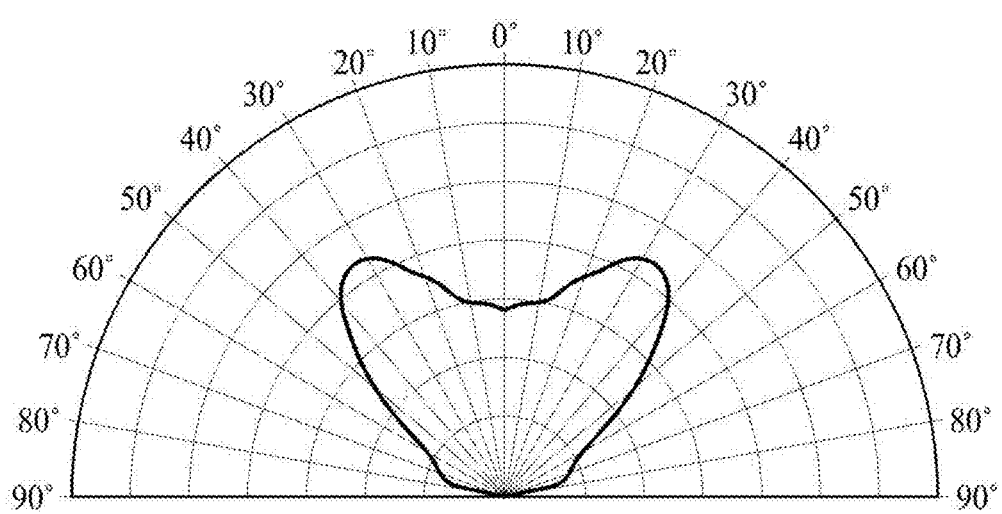
FIG. 7C illustrates a light distribution of a light source according to an example embodiment of the present disclosure.

FIG. 7A illustrates a light distribution of a light source to which a micro-cavity structure is not applied. FIG. 7B illustrates a light distribution of a light source to which the micro-cavity structure is applied. FIG. 7C illustrates a light distribution of a light source according to an example embodiment of the present disclosure. In a light source to which the micro-cavity structure is not applied and a light source to which the micro-cavity structure is applied, the amount of emitted light may be at a maximum when emitted at an angle of 0 degrees, as illustrated in FIGS. 7A and 7B.

The micro-cavity structure may not be applied, and as illustrated in FIG. 7C, the amount of emitted light may be at a maximum when emitted at an angle greater than 0 degrees. In an example embodiment, a light distribution may be obtained by adjusting a thickness of the organic light emitting layer 130. The organic light emitting layer 130 may have thicknesses that differ in the red pixel RP, the green pixel GP, and the blue pixel BP, based on a resonance distance where a micro-cavity may not be maximized. The red pixel RP, the green pixel GP, and the blue pixel BP may differ in thickness of the organic light emitting layer 130.

In another example embodiment, a light distribution may be obtained by adjusting a thickness of the first electrode 120. The first electrode 120 may have thicknesses that differ in the red pixel RP, the green pixel GP, and the blue pixel BP, based on the resonance distance where the micro-cavity may not be maximized. The red pixel RP, the green pixel GP, and the blue pixel BP may differ in thickness of the first electrode 120.

Figure 8A:
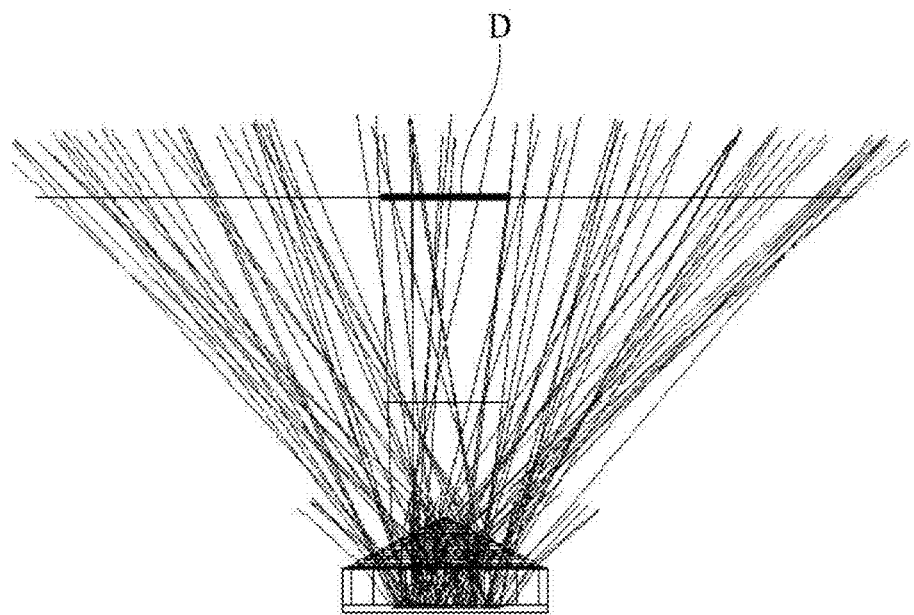
FIG. 8A illustrates a simulation result of the light source of FIG. 7A.
Figure 8B:
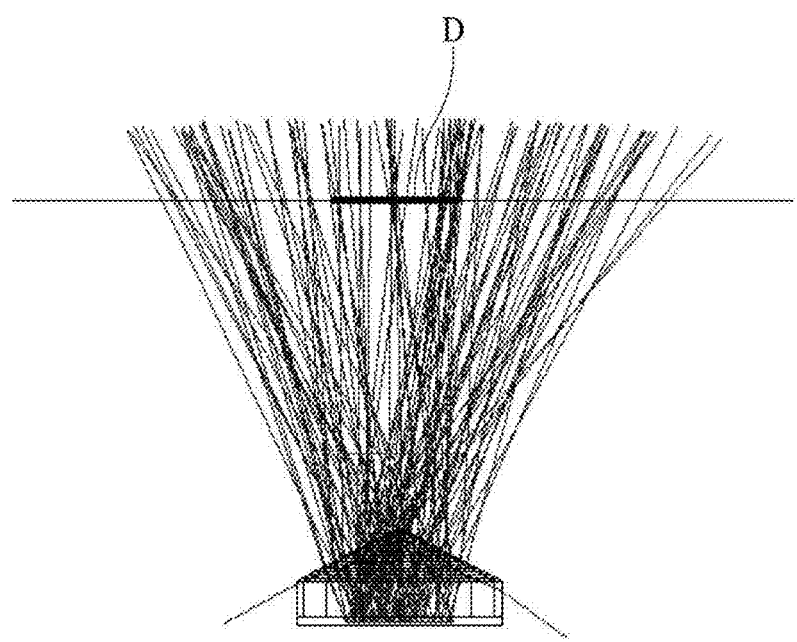
FIG. 8B illustrates a simulation result of the light source of FIG. 7B.
Figure 8C:
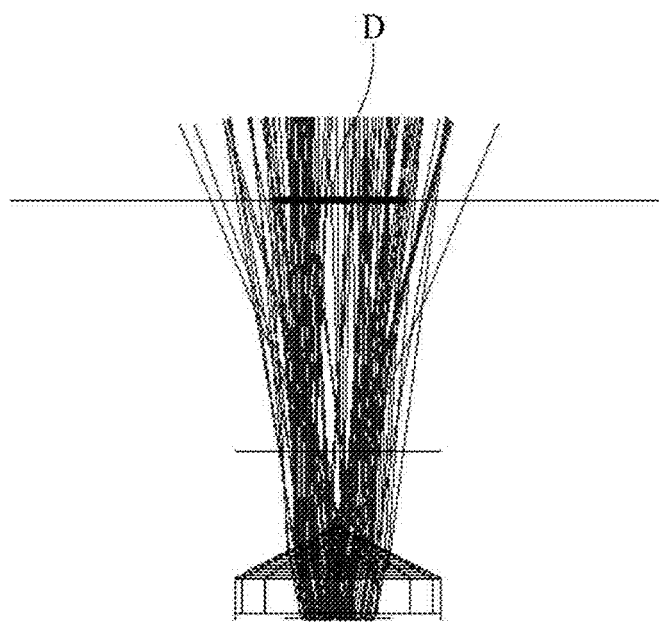
FIG. 8C illustrates a simulation result of the light source of FIG. 7C.

FIG. 8A illustrates a simulation result of the light source of FIG. 7A. FIG. 8B illustrates a simulation result of the light source of FIG. 7B. FIG. 8C illustrates a simulation result of the light source of FIG. 7C. FIG. 8A illustrates a simulation result obtained by performing a simulation where the light source of FIG. 7A may be applied to a portion under the organic layer 152 including the light collecting structure. In the simulation result, a light amount of 3.75 mW/cm$^2$ was detected by a detection apparatus D.

FIG. 8B illustrates a simulation result obtained by performing a simulation where the light source of FIG. 7B may be applied to the portion under the organic layer 152 including the light collecting structure. In the simulation result, a light amount of 4.12 mW/cm$^2$ was detected by a detection apparatus D. FIG. 8C illustrates a simulation result obtained by performing a simulation where the light source of FIG. 7C may be applied to the portion under the organic layer 152 including the light collecting structure. In the simulation result, a light amount of 4.91 mW/cm$^2$ was detected by a detection apparatus D. For example, by applying a light source having a light distribution where the amount of emitted light is at a maximum when emitted at an angle of more than 0 degrees, as illustrated in FIG. 7C, the display apparatus 100 according to an example embodiment of the present disclosure may maximize a light collection effect.

Figure 9A:
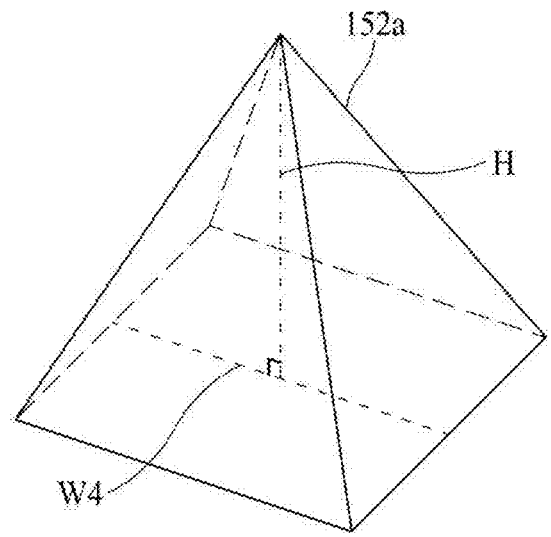
FIG. 9A illustrates an example of a light collecting structure.
Figure 9B:
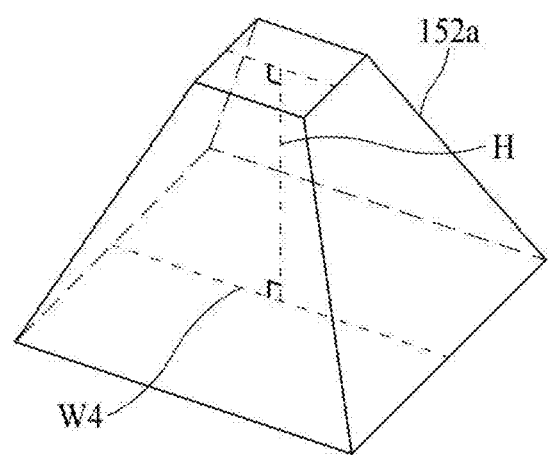
FIG. 9B illustrates another example of a light collecting structure.
Figure 10A:
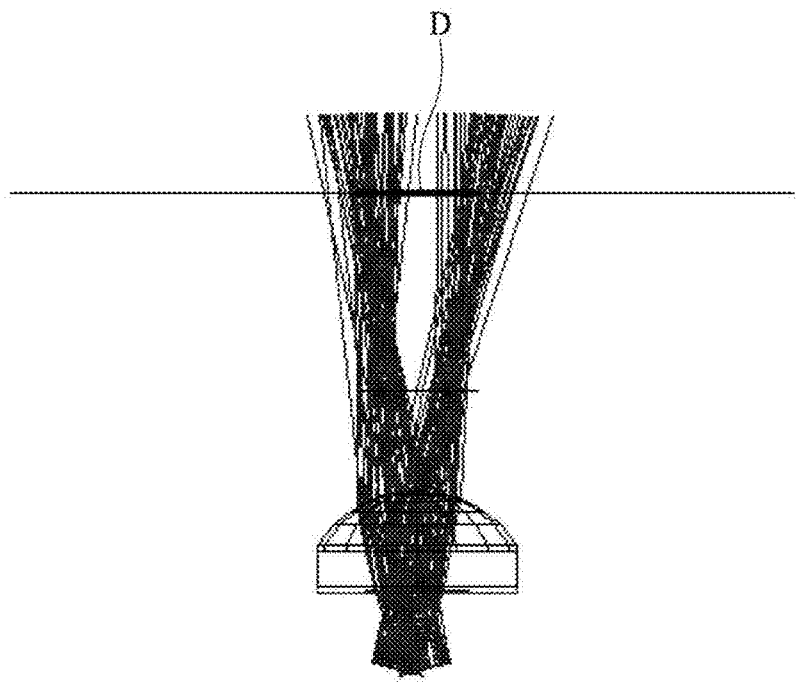
FIG. 10A illustrates a simulation result of a light collecting structure having a hemispherical shape.
Figure 10B:
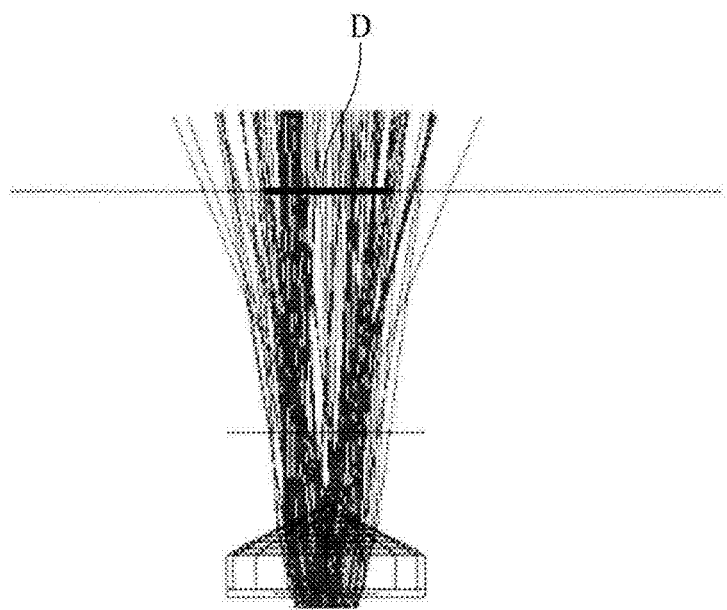
FIG. 10B illustrates a simulation result of a light collecting structure having a quadrangular horn shape.

FIG. 9A illustrates an example of a light collecting structure. FIG. 9B illustrates another example of a light collecting structure. FIG. 10A illustrates simulation result of a light collecting structure having a hemispherical shape. FIG. 10B illustrates a simulation result of a light collecting structure having a three-dimensional quadrangular horn shape. The light collecting structure may have a three-dimensional quadrangular horn shape illustrated in FIG. 9A or a three-dimensional quadrangular truncated-horn shape illustrated in FIG. 9B. A height "h" of the light collecting structure may be adjusted based on a thickness of the organic layer 152 that may be determined in designing a product. The height "h" of the light collecting structure may be equal to or less than the thickness of the organic layer 152. As the height "h" of the light collecting structure increases, light collection efficiency may be enhanced. Therefore, if the height "h" of the light collecting structure is equal to the thickness of the organic layer 152, light collection efficiency may be maximally enhanced.

Due to a manufacturing process error, a portion of the light collecting structure may protrude without being covered by the low refraction organic layer 152b, and light collection efficiency may be reduced and Moire may occur. In order to prevent such problems, the height "h" of the light collecting structure may be designed to be less than the thickness of the organic layer 152. For example, the high refraction organic layer 152a including the light collecting structure may be covered by the low refraction organic layer 152b. Accordingly, light collection efficiency may be optimized, and the occurrence of Moire may be prevented.

Moreover, a width "W4" of a lower surface of the light collecting structure may be adjusted based on a width of the pixel P that may be determined in designing a product. The width "W4" of the light collecting structure may be equal to or greater than the width of the pixel P. Therefore, the light collecting structure may collect light emitted from each pixel P without loss of the emitted light.

The light collecting structure may have a three-dimensional quadrangular horn shape or a three-dimensional quadrangular truncated-horn shape, and thus, may have a good light collection effect. FIG. 10A illustrates a simulation result of a light collecting structure having a hemispherical shape. In the simulation result, a light amount of 4.35 mW/cm$^2$ was detected by a detection apparatus D. FIG. 10B illustrates a simulation result of a light collecting structure having a three-dimensional quadrangular horn shape. In the simulation result, a light amount of 4.91 mW/cm$^2$ was detected by a detection apparatus D. For example, compared with the light collecting structure having a hemispherical shape, the light collecting structure having a three-dimensional quadrangular horn shape has a good light collection effect.

Figure 11:
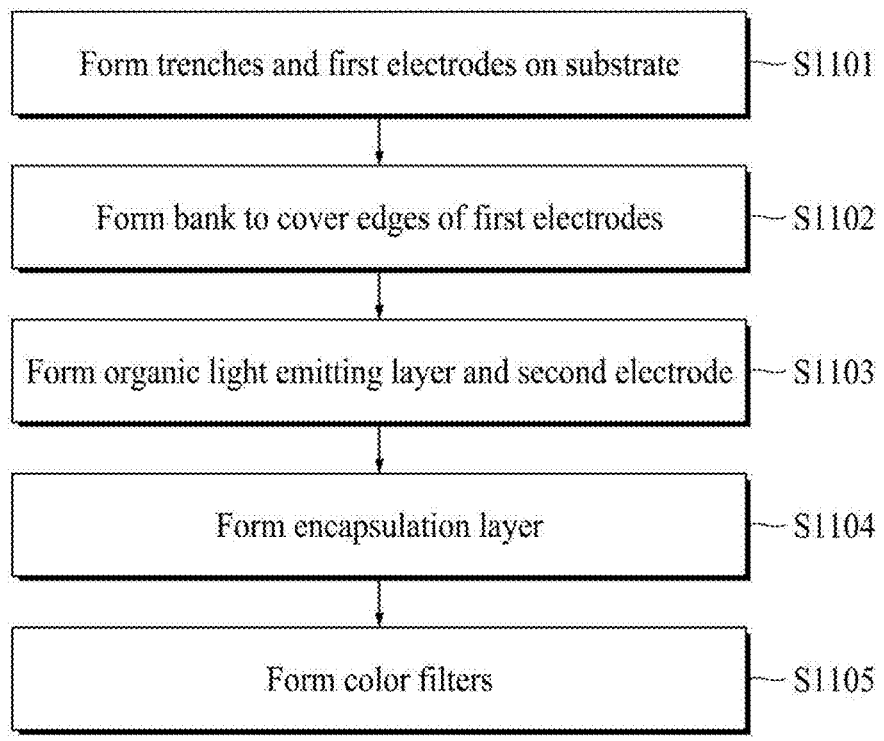
FIG. 11 is a flowchart illustrating a method of manufacturing a display apparatus according to an example embodiment of the present disclosure.
Figure 12A:
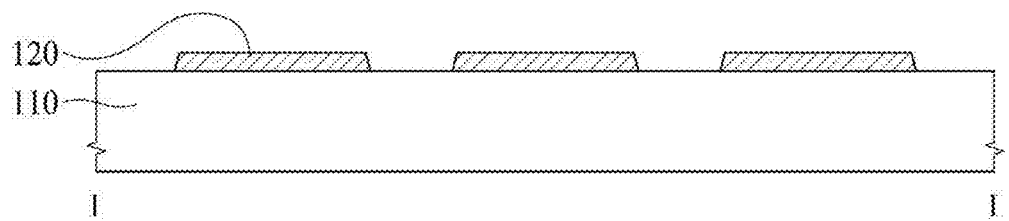
FIGS. 12A to 12H are cross-sectional views illustrating a method of manufacturing a display apparatus according to an example embodiment of the present disclosure.
Figure 12B:
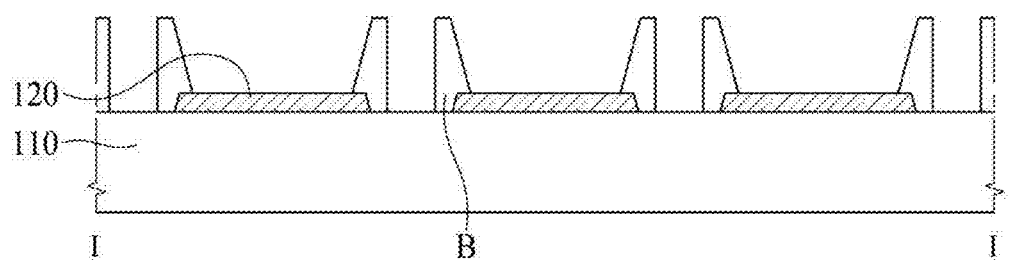
Figure 12C:
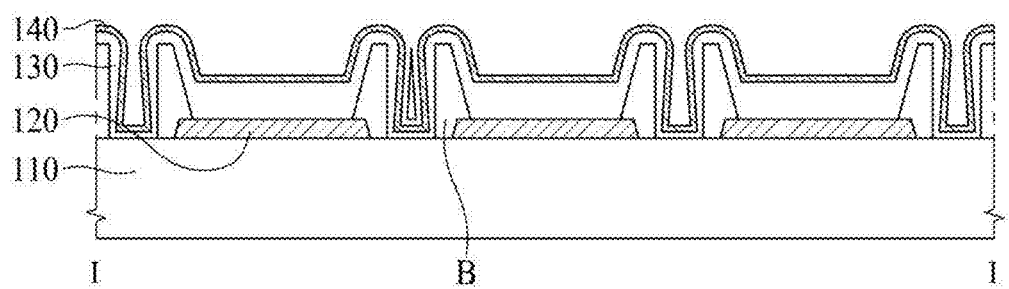
Figure 12D:
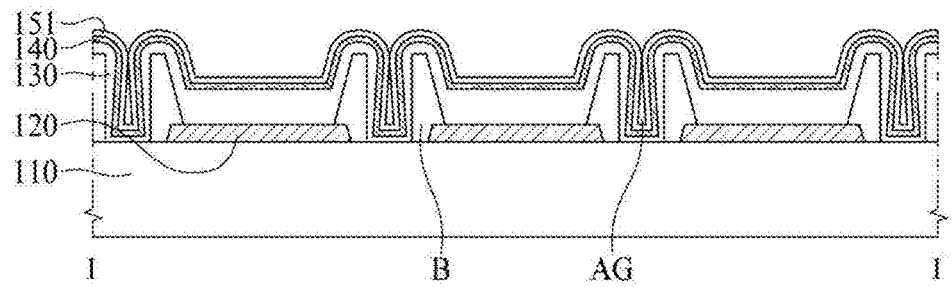
Figure 12E:
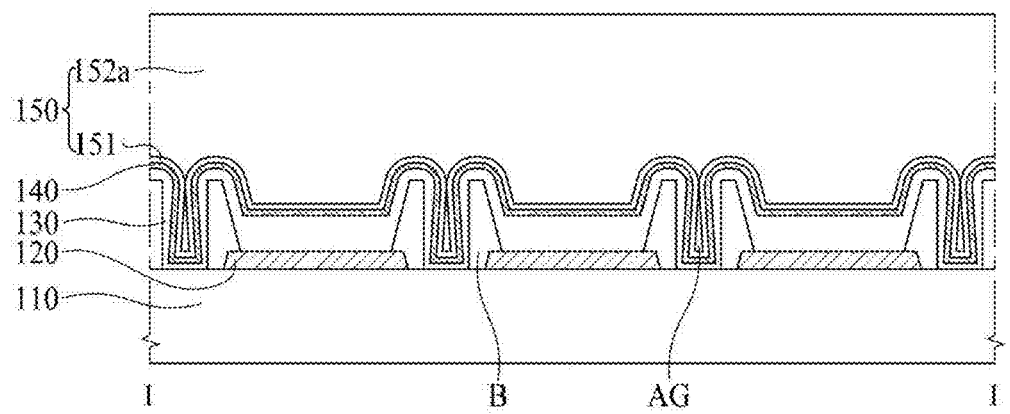
Figure 12F:
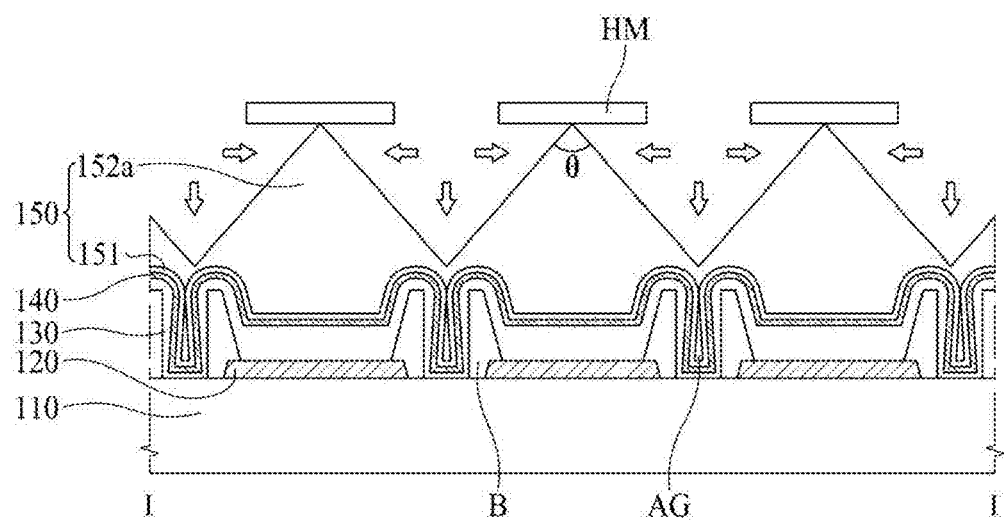
Figure 12G:
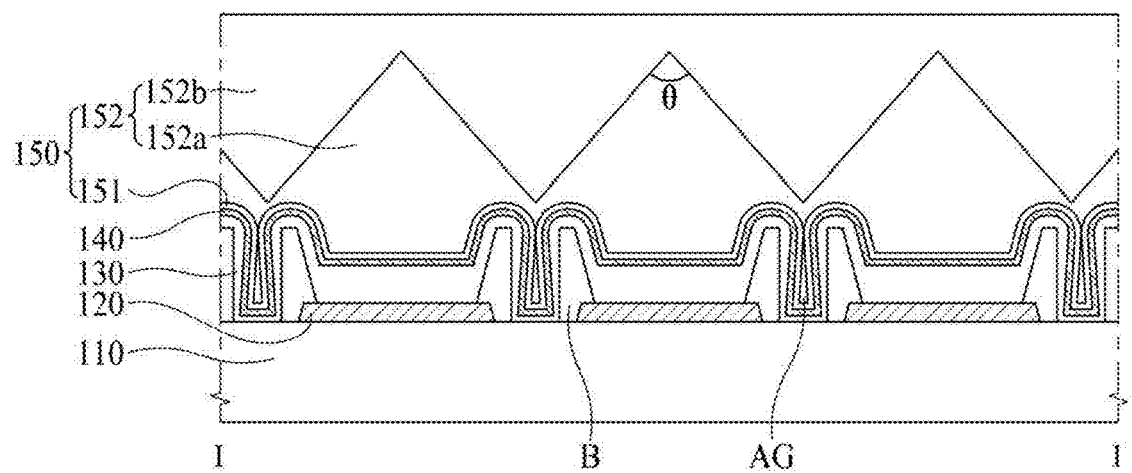
Figure 12H:
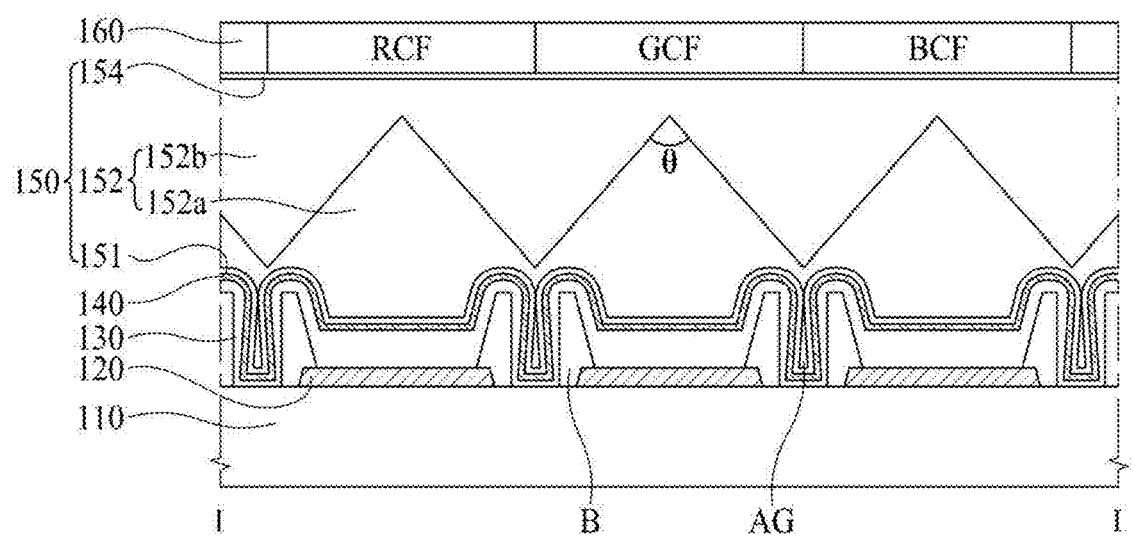

FIG. 11 is a flowchart illustrating a method of manufacturing a display apparatus according to an example embodiment of the present disclosure. FIGS. 12A to 12H are cross-sectional views illustrating a method of manufacturing a display apparatus according to an example embodiment of the present disclosure. First, a plurality of transistors (not shown) and a plurality of first electrodes 120 may be formed on a substrate 110 (S1101). An active layer of each of the transistors may be formed on the substrate 110. The active layer may be formed of a silicon-based semiconductor material and/or an oxide-based semiconductor material.

Subsequently, a gate insulation layer may be formed on the active layer. The gate insulation layer may be formed of an inorganic layer (for example, SiOx, SiNx, or a multilayer thereof). Subsequently, a gate electrode may be formed on the gate insulation layer. Subsequently, a first insulation layer may be formed on the active layer and the gate electrode. The first insulation layer may be formed of an inorganic layer (for example, SiOx, SiNx, or a multilayer thereof).

Subsequently, first and second contact holes connected to the active layer through the first insulation layer may be formed. A source electrode connected to the active layer through the first contact hole and a drain electrode connected to the active layer through the second contact hole may be formed on the first insulation layer. Subsequently, the first insulation layer may be additionally formed on the source electrode and the drain electrode. A third contact hole connected to the drain electrode through the additionally formed first insulation layer may be formed. An M3 metal layer connected to the drain electrode through the third contact hole may be formed on the additionally formed first insulation layer.

Subsequently, a second insulation layer may be formed on the M3 metal layer. The second insulation layer may be formed of an inorganic layer (for example, SiOx, SiNx, or a multilayer thereof). Subsequently, a fourth contact hole connected to an M3 metal layer through the second insulation layer may be formed. An M4 metal layer connected to the M3 metal layer through the fourth contact hole may be formed on the second insulation layer. Subsequently, the second insulation layer may be additionally formed on the M4 metal layer. A fifth contact hole connected to the M4 metal layer through the additionally formed second insulation layer may be formed. Alternatively, the M3 metal layer, the M4 metal layer, and the second insulation layer may be omitted.

Subsequently, the first electrodes 120 may be formed on the substrate 110. A first electrode layer may be formed on the second insulation layer. For example, the first electrode layer may include a metal material, which may be high in reflectance, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy may be an alloy of Ag, Pd, and Cu. Subsequently, a photoresist pattern may be formed on the first electrode layer. The photoresist pattern may be formed at a position at which pixels P are to be formed. The first electrodes 120 may be formed by dry-etching the first electrode layer uncovered by the photoresist pattern, and the photoresist pattern may be removed. Subsequently, a bank B may be formed to cover edges of the first electrodes 120 (S1102).

A charging material may be formed on the first electrodes 120. The charging material may be an organic material (for example, acryl resin, epoxy resin, phenolic resin, polyamide resin, and/or polyimide resin). Subsequently, the bank B may be performed through dry-etching. A dry-etching material may be capable of etching the charging material, but may be selected as a material incapable of etching the first electrodes 120. Subsequently, a trench T may be formed in the bank B. The photoresist pattern may be formed in a region other than a region where the trench T is to be formed, of the bank B. The trench T may be formed by etching the bank B that may be exposed without being covered by the photoresist pattern, and the photoresist pattern may be removed.

Subsequently, an organic light emitting layer 130 and a second electrode 140 may be sequentially formed. The organic light emitting layer 130 may be formed on the first electrodes 120 and the bank B. The organic light emitting layer 130 may be formed through a deposition process or a solution process. If the organic light emitting layer 130 is formed through the deposition process, the organic light emitting layer 130 may be formed by using an evaporation process. The organic light emitting layer 130 may be a white light emitting layer that emits white light. The organic light emitting layer 130 may be may be provided in each of the pixels P. If the organic light emitting layer 130 is a white light emitting layer, the organic light emitting layer 130 may be in a tandem structure of two or more stacks. Each of the stacks may include a hole transporting layer, at least one light emitting layer, and an electron transporting layer.

Moreover, a charge generating layer may be between adjacent stacks. The charge generating layer may include an n-type charge generating layer disposed adjacent to a lower stack, and a p-type charge generating layer that may be on the n-type charge generating layer and may be adjacent to an upper stack. The n-type charge generating layer may inject an electron into the lower stack, and the p-type charge generating layer may inject a hole into the upper stack. The n-type charge generating layer may be formed of an organic layer doped with alkali metal, such as lithium (Li), sodium (Na), potassium (K), or cesium (Cs) or alkali earth metal such as magnesium (Mg), strontium (Sr), barium (Ba), and/or radium (Ra). The p-type charge generating layer may be formed by doping a dopant on an organic material having an ability to transport holes.

Because the organic light emitting layer 130 is formed through the evaporation process, the organic light emitting layer 130 may not have a good step coverage characteristic. Accordingly, the organic light emitting layer 130 may be formed not to have a constant thickness in a region where a step height occurs due to the trench T provided in the bank B. The organic light emitting layer 130 may be formed thickly in a portion that may be bent from an upper surface of the bank B to a side surface of the trench T. A thickness of the organic light emitting layer 130 in a boundary portion between the upper surface of the bank B and a first side surface of the trench T may be set to be thicker than that of the organic light emitting layer 130 in the first side surface or a floor of the trench T. Also, a thickness of the organic light emitting layer 130 in a boundary portion between the upper surface of the bank B and a second side surface of the trench T may be set to be thicker than that of the organic light emitting layer 130 in the second side surface or the floor of the trench T. The first side surface and the second side surface of the trench T may face each other. As a result, an inner portion of the trench T may be narrowed in a direction from a lower portion to an upper portion thereof.

Moreover, a thickness of the organic light emitting layer 130 in a sidewall of the trench T provided in the bank B may be thinner than that of the organic light emitting layer 130 in the floor of the trench T. Subsequently, the second electrode 140 may be formed on the organic light emitting layer 130 (S1103). The second electrode 140 may be provided in each of the pixels P. The second electrode 140 may be formed of a transparent conductive material (or TCO), such as ITO or IZO, and/or a semi-transmissive conductive material, such as magnesium (Mg), silver (Ag), or an alloy of Mg and Ag.

The second electrode 140 may be formed through a physics vapor deposition (PVD) process, such as a sputtering process. A layer formed through the PVD process such as the sputtering process may have a good step coverage characteristic. Therefore, despite a step height being caused by the trench T provided in the bank B, the second electrode 140 may be on the sidewall and the floor of the trench T, thereby having a uniform thickness compared to the organic light emitting layer 130. Subsequently, an encapsulation layer 150 may be formed on the second electrode 140 (S1104).

A first inorganic layer 151 may be formed on the first electrode 140. The first inorganic layer 151 may be formed of silicon nitride, aluminum nitride, zirconium nitride, titanium nitride, hafnium nitride, tantalum nitride, silicon oxide, aluminum oxide, and/or titanium oxide. The first inorganic layer 151 may be deposited through a chemical vapor deposition (CVD) process or an atomic layer deposition (ALD) process.

Subsequently, a high refraction organic layer 152*a* may be formed on the first inorganic layer 151. A high refraction organic material having a high refractive index (for example, a refractive index of 1.7 or more) may be formed on the first inorganic layer 151. Subsequently, a hard mask HM may be on the high refraction organic material, and by performing isotropic etching, the high refraction organic layer 152a may be formed. Alternatively, the hard mask HM may be removed.

Subsequently, a low refraction organic layer 152b may be formed of the high refraction organic layer 152a. For example, the low refraction organic layer 152b may be formed of an organic material having a refractive index (for example, a refractive index of less than 1.7), which may be less than that of the high refraction organic layer 152a. For example, the low refraction organic layer 152b may be formed of a monomer. Subsequently, a second inorganic layer 153 may be formed on the low refraction organic layer 152b. The second inorganic layer 153 may be formed of silicon nitride, aluminum nitride, zirconium nitride, titanium nitride, hafnium nitride, tantalum nitride, silicon oxide, aluminum oxide, and/or titanium oxide. The second inorganic layer 153 may be deposited through a chemical vapor deposition (CVD) process or an atomic layer deposition (ALD) process.

Subsequently, a color filter 160 may be formed on the encapsulation layer 150 (S1105). The color filter 160 may correspond to each of the pixels P. For example, a red color filter RCF may correspond to a red pixel RP, a green color filter GCF may correspond to a green pixel GP, and a blue color filter BCF may correspond to a blue pixel BP. Although not illustrated in the drawings, an encapsulation film may be on the color filter 160.

Figure 13A:
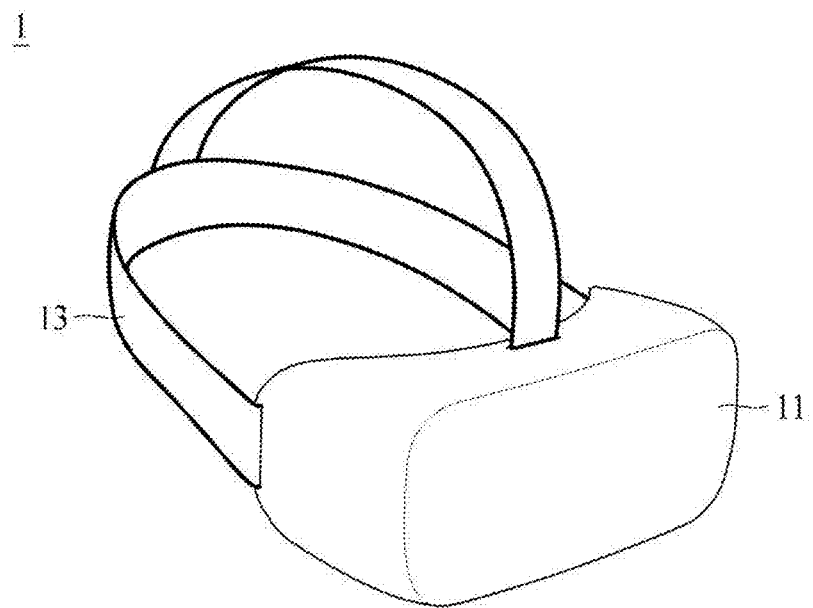
FIG. 13A illustrates an HMD to which a display apparatus according to an example embodiment of the present disclosure may be applied.
Figure 13B:
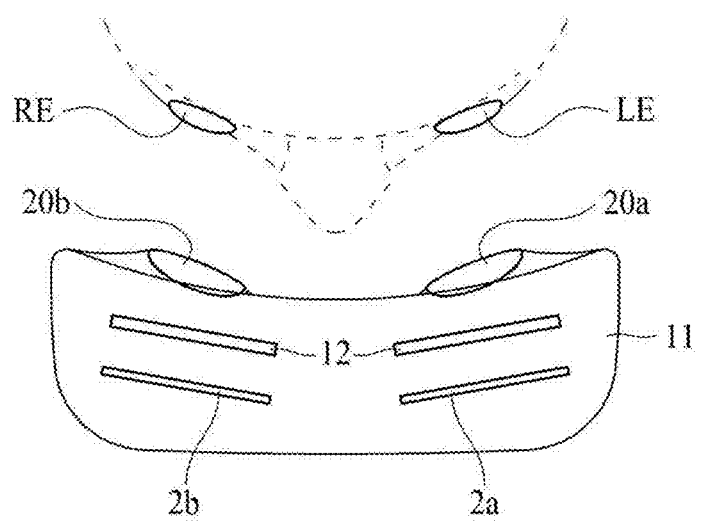
FIG. 13B illustrates an example of an accommodating case of FIG. 13A.

FIG. 13A illustrates an HMD to which a display apparatus according to an example embodiment of the present disclosure may be applied. FIG. 13B illustrates an example of an accommodating case of FIG. 13A. As illustrated in FIGS. 13A and 13B, an HMD 1 to which the display apparatus according to an example embodiment of the present disclosure is applied may include an accommodating case 11, a left-eye lens 20a, a right-eye lens 20b, a lens array 12, and a head-mounted band 13.

The accommodating case 11 may accommodate a display panel 2 and may provide the left-eye lens 20a and the right-eye lens 20b with an image displayed by the display panel 2. The display panel 2 may be the display apparatus according to an example embodiment of the present disclosure. The accommodating case 11 may include a left-eye display panel 2a disposed in front of the left-eye lens 20a and a right-eye display panel 2b disposed in front of the right-eye lens 20b.

The left-eye display panel 2a and the right-eye display panel 2b may display the same image, and a user may watch a two-dimensional (2D) image. Alternatively, the left-eye display panel 2a may display a left-eye image and the right-eye display panel 2b may display a right-eye image, and the user may watch a stereoscopic image. Each of the left-eye display panel 2a and the right-eye display panel 2b may be an organic light emitting display apparatus.

The accommodating case 11 may further include a lens array 12 between the left-eye display panel 2a and the left-eye lens 20a, and a lens array 12 disposed between the right-eye display panel 2b and the right-eye lens 20b. The lens array 12 may be a micro-lens array. The lens array 12 may be replaced by a pin hole array. By using the lens arrays 12, an image displayed by the left-eye display panel 2a or the right-eye display panel 2b may be seen by the user as an enlarged image. A left eye LE of the user may be located in the left-eye lens 20a, and a right eye RE of the user may be located in the right-eye lens 20b. For example, each of the left-eye lens 20a and the right-eye lens 20b may correspond to an eyepiece lens disposed in front of the display panel 2. The head-mounted band 13 may be fixed to the accommodating case 11. The head-mounted band 13 is illustrated as surrounding an upper surfaces and both side surfaces of a head of the user. The head-mounted band 13 may fix an HMD to the head of the user and may be a glasses frame or a helmet.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus, comprising:
   a substrate including a plurality of pixels configured to emit light, wherein the amount of emitted light is at a maximum when emitted at an angle of more than 0 degrees; and
   an encapsulation layer covering the plurality of pixels and including a plurality of light collecting structures each having a three-dimensional quadrangular horn shape or a three-dimensional quadrangular truncated-horn shape,
   wherein the plurality of light collecting structures are disposed to respectively correspond to the plurality of pixels in a one-to-one relationship,
   wherein each of the plurality of light collecting structures overlaps the corresponding pixel, and a width of a lower surface of each of the plurality of light collecting structures is equal to or greater than the width of the corresponding pixel, and
   wherein each of the plurality of pixels comprises:
      a plurality of first electrodes disposed on the substrate;
      a bank covering one or more edges of the plurality of first electrodes, wherein the bank includes a trench;
      an organic light emitting layer disposed on the plurality of first electrodes and the bank; and
      a second electrode disposed on the organic light emitting layer,
   wherein an air gap is provided in the trench provided in the bank.

2. The display apparatus of claim 1, wherein the encapsulation layer comprises:
   a first inorganic layer covering the plurality of pixels;
   an organic layer disposed on the first inorganic layer; and
   a second inorganic layer covering the organic layer.

3. The display apparatus of claim 2, wherein the organic layer comprises:
   a high refraction organic layer including the plurality of light collecting structures, wherein the plurality of light collecting structures collect a portion of light emitted from each of the plurality of pixels; and
   a low refraction organic layer on the high refraction organic layer.

4. The display apparatus of claim 3, wherein the high refraction organic layer has a first refractive index, and the low refraction organic layer has a second refractive index that is less than the first refractive index.

5. The display apparatus of claim 4, wherein the first refractive index is equal to or greater than 1.7, and the second refractive index is less than 1.7.

6. The display apparatus of claim 3, wherein each of the plurality of light collecting structures has a height that is less than a thickness of the organic layer.

7. The display apparatus of claim 1, wherein the organic light emitting layer is on each of a sidewall of the trench and a floor of the trench.

8. The display apparatus of claim 1, wherein the trench passes through the bank.

9. The display apparatus of claim 1, wherein the organic light emitting layer is a white light emitting layer in each of the plurality of pixels.

10. The display apparatus of claim 1, further comprising a color filter disposed on the encapsulation layer.

11. A head-mounted display, comprising:
a display panel;
a lens array including a plurality of lenses configured to enlarge an image displayed by the display panel; and
an accommodating case configured to accommodate the display panel and the lens array,
wherein the display panel comprises:
 a substrate including a plurality of pixels configured to emit light, wherein the amount of emitted light is at a maximum when emitted at an angle of more than 0 degrees; and
 an encapsulation layer covering the plurality of pixels and including a plurality of light collecting structures each having a three-dimensional quadrangular horn shape or a three-dimensional quadrangular truncated-horn shape,
wherein the plurality of light collecting structures are disposed to respectively correspond to the plurality of pixels in a one-to-one relationship,
wherein each of the plurality of light collecting structures overlaps the corresponding pixel, and a width of a lower surface of each of the plurality of light collecting structures is equal to or greater than the width of the corresponding pixel, and
wherein each of the plurality of pixels comprises:
 a plurality of first electrodes disposed on the substrate;
 a bank covering one or more edges of the plurality of first electrodes, wherein the bank includes a trench;
 an organic light emitting layer disposed on the plurality of first electrodes and the bank; and
 a second electrode disposed on the organic light emitting layer,
wherein an air gap is provided in the trench provided in the bank.

12. The head-mounted display of claim 11, wherein the encapsulation layer comprises:
a first inorganic layer covering the plurality of pixels;
an organic layer disposed on the first inorganic layer; and
a second inorganic layer covering the organic layer.

13. The head-mounted display of claim 12, wherein the organic layer comprises:
a high refraction organic layer including the plurality of light collecting structures, wherein the plurality of light collecting structures collect a portion of light emitted from each of the plurality of pixels; and
a low refraction organic layer on the high refraction organic layer.

14. A display panel, comprising:
a substrate including a plurality of pixels configured to emit light, wherein the amount of emitted light is at a maximum when emitted at an angle of more than 0 degrees; and
an encapsulation layer covering the plurality of pixels and including a plurality of light collecting structures each having a three-dimensional quadrangular horn shape or a three-dimensional quadrangular truncated-horn shape,
wherein the plurality of light collecting structures are disposed to respectively correspond to the plurality of pixels in a one-to-one relationship,
wherein each of the plurality of light collecting structures overlaps the corresponding pixel, and a width of a lower surface of each of the plurality of light collecting structures is equal to or greater than the width of the corresponding pixel, and
wherein each of the plurality of pixels comprises:
 a plurality of first electrodes disposed on the substrate;
 a bank covering one or more edges of the plurality of first electrodes, wherein the bank includes a trench;
 an organic light emitting layer disposed on the plurality of first electrodes and the bank; and
 a second electrode disposed on the organic light emitting layer,
wherein an air gap is provided in the trench provided in the bank.

15. The display panel of claim 14, wherein the encapsulation layer comprises:
a first inorganic layer covering the plurality of pixels;
an organic layer disposed on the first inorganic layer; and
a second inorganic layer covering the organic layer.

16. The display panel of claim 15, wherein the organic layer comprises:
a high refraction organic layer including the plurality of light collecting structures, wherein the plurality of light collecting structures collect a portion of light emitted from each of the plurality of pixels; and
a low refraction organic layer on the high refraction organic layer.

* * * * *